United States Patent [19]

Roberts

[11] Patent Number: 5,206,532
[45] Date of Patent: Apr. 27, 1993

[54] BURIED CONTACT BETWEEN POLYSILICON GATE AND DIFFUSION AREA

[75] Inventor: Martin C. Roberts, Boise, Id.

[73] Assignee: Micron Technology, Inc., Boise, Id.

[21] Appl. No.: 748,796

[22] Filed: Aug. 22, 1991

Related U.S. Application Data

[62] Division of Ser. No. 592,121, Oct. 3, 1990, Pat. No. 5,064,776.

[51] Int. Cl.$^5$ .................... H01L 29/04; H01L 27/02
[52] U.S. Cl. ................................ 257/382; 257/380; 257/754; 257/756; 257/904
[58] Field of Search .............. 357/59 K; 437/162; 257/382, 380, 754, 756, 904

[56] References Cited

U.S. PATENT DOCUMENTS 4,413,402  11/1983  Erb ............................. 29/571
4,939,104   7/1990  Pollack et al. ............... 437/162

Primary Examiner—Rolf Hille
Assistant Examiner—Robert Limanek
Attorney, Agent, or Firm—Workman Nydegger Jensen

[57] ABSTRACT

A buried contact between the gate of a transistor device formed at the surface of a semiconductor substrate and a diffusion region formed in the surface of the substrate remote from the transistor device. The buried contact includes a polysilicon interconnect structure formed after shaping of the gate layer and the gate insulator. The polysilicon interconnect structure engages a side edge and an adjoining lower surface of the gate layer at a location where the gate insulator has been removed by isotropic etching from between the gate layer and the surface of the substrate. The polysilicon interconnect layer also contacts the surface of the substrate beneath an overhanging edge of the gate layer so as to form a surface current pathway interface. Below the surface current pathway interface a migration region is formed by heat-induced movement of ions from the gate layer through the polysilicon interconnect structure. The migration region extends laterally away from the gate layer to make contact with a remote diffusion region, thereby effecting with the polysilicon interconnect structure the desired buried-contact.

12 Claims, 8 Drawing Sheets

BURIED CONTACT BETWEEN POLYSILICON GATE AND DIFFUSION AREA

This application is a divisional of application Ser. No. 07/592,121, filed Oct. 3, 1990, now U.S. Pat. No. 5,064,776 issued Nov. 12, 1991.

BACKGROUND

1. Field of the Invention

This invention pertains to semiconductor integrated circuits, and more specifically to the effecting of a reliable buried contact between the gate of a transistor device and a diffusion area separated from the transistor device. The invention has particular applicability to integrated circuits for use in memory and logic cells.

2. Background Art

The trend in semiconductor integrated circuitry continues to involve a decrease in the size of individual semiconductor structures accompanied by an increase in the complexity and number of such structures aggregated on a single semiconductor integrated chip. Single semiconductor devices have been grouped into integrated circuits, which in turn have been further densified into large scale integrated semiconductor systems. Structural flaws which previously passed unnoticed in individual semiconductor devices and integrated semiconductor circuit systems have become significant, debilitating structural shortcomings in intensely miniaturized, densely packed large scale integration efforts.

In memory cells and in logic cells, for example, it has been common to interconnect the gate of a transistor device through the surface of the semiconductor substrate upon which it is located to various diffusion areas formed in the surface of that substrate at locations remote from the transistor device itself. The problems inherent in accomplishing this objective are numerous, but such problems become more prominent as the semiconductor devices involved are rendered in progressively smaller scale and in increasingly densified arrangements with other devices.

An example of such a typical memory cell is shown schematically in FIG. 1 as comprising a pair of transistors $T_1$ and $T_2$ each series connected with a respective biasing resistor $R_1$ and $R_2$ between a bias voltage V+ and ground. Transistor $T_1$ comprises a source $S_1$, a drain $D_1$, and a gate $G_1$ therebetween for governing current flow through transistor $T_1$. Correspondingly, transistor $T_2$ comprises a source $S_2$, a drain $D_2$, and a gate $G_2$ located therebetween.

Typically a transistor device, such as $T_1$ or $T_2$, is formed at the surface of a semiconductor substrate so as to assume in elevation a cross-sectional structure such as that shown in FIG. 2. There it can be seen that the elements of transistor $T_1$ are located on a substrate 12 at a p-type conductivity well 14 formed in the surface 16 thereof. The gate $G_1$ of transistor $T_1$ comprises a polysilicon gate layer 18 having a top surface 19 and being disposed on a gate insulator 20 on surface 16 of substrate 12. Typically gate insulator 20 is formed of silicon dioxide. To either side of gate $G_1$ are formed n+ diffusion regions 22, 24 which function as the source $S_1$ and the drain $D_1$ of transistor $T_1$, respectively.

The elements of transistor $T_1$ are electrically isolated from the balance of substrate 12 by the combination of relatively thick, surrounding oxide barriers 26 on surface 16 of substrate 12 and p-type conductivity well 14 formed therein. Conductivity well 14 must, therefore, extend deep enough into substrate 12 from surface 16 thereof to prevent the electrical current that passes through the elements of transistor $T_1$ from leaking out of conductivity well 14 into substrate 12. Nevertheless, the evolution of large scale integrated circuitry imposes on circuit designs an imperative for shallower conductivity wells.

Leakage currents degrade seriously the ability of any semiconductor device, such as transistor $T_1$, to function in the manner intended. The consequences of excessive leakage currents in the context of memory and logic cells are a concern and will be discussed subsequently. First, however, the cause of leakage currents, as well as some other related dysfunctionalities, will be explored relative to manufacturing a buried contact between a gate of a transistor device, such as gate $G_1$, and a diffusion region formed in the surface of a semiconductor substrate remote therefrom.

It is common in configuring a pair of transistors into a memory cell, such as transistors $T_1$ and $T_2$ in FIG. 1, to cross-couple the gate of one transistor to the source of the other. Thus, as seen in FIG. 1, gate $G_1$ of transistor $T_1$ is coupled through a current path 28 to the diffusion region which functions as the drain $D_2$ of transistor $T_2$. Similarly, gate $G_2$ of transistor $T_2$ is coupled by another current pathway 30 to the diffusion region which functions as the drain $D_1$ of transistor $T_1$.

Current pathways 28 and 30 are generally not formed through the top surface 19 of a gate layer 18, but rather through other portions of the gate structure. The current pathway is thus buried in the structures of the semiconductor device surrounding and underlying the gate layer 18, ensuring electrical isolation from other circuit paths and leaving the top surface 19 of gate layer 18 free for other interconnections. The cause of leakage currents and of other selected structural shortcomings associated with buried contacts, such as current pathways 28, 30, will best be understood through a brief exploration of a typical manner in which such buried contacts are actually fabricated. This will be explained using the sequence of drawings comprising FIGS. 3A through 3E.

In FIG. 3A, a thin insulative layer 32 of silicon oxide has been grown on surface 16 of substrate 12 at p-type conductivity well 14. Through subsequent processing, insulative layer 32 will be formed into a gate insulator, such as gate insulator 20 shown in FIG. 2. Toward this end, a photo-resist mask 34 is formed over the entirety of insulative layer 32, and an opening 36 is developed therein. Thereafter, insulative layer 32 is etched from surface 16 of substrate 12 through opening 36.

As shown in FIG. 3B, this etching process isolates from insulative layer 32 by a separation distance 38 a portion thereof which will ultimately function as gate insulator 20. A thick polysilicon layer 40 is then deposited over insulative layer 32 and gate insulator 20, as well as over the portion of surface 16 of substrate 12 exposed in separation 38 therebetween. Through subsequent etching yet to be described, polysilicon layer 40 is intended to be fashioned into the gate, such as gate layer 18 shown in FIG. 2, of a transistor device. In addition, however, a portion of gate layer 18 will be connected by a current pathway, such as current pathway 28, to a diffusion region formed in substrate 12 remote from gate layer 18.

Toward this end, in FIG. 3B a second photo-resist mask 42 is formed over polysilicon layer 40 and developed so as to terminate over separation 38. The portion of polysilicon layer 40 unprotected by second photo-resist mask 42 is then removed by dry etching. Because of the thickness of polysilicon layer 40 and the need to insure its total removal in the areas not covered by second photo-resist mask 42, over etching is called for. Insulative layer 32 is exposed by the removal of polysilicon layer 40 and resists further etching. Nevertheless at the surface 16 of substrate 12 that is not protected by insulative layer 32 or second photo-resist mask 42, the removal of material by etching continues, creating a relatively deep trench 44 (FIG. 3C).

The portion of polysilicon layer 40 remaining following this etching comprises gate layer 18 which, for example, can function with gate insulation 20 as the gate $G_1$ of a transistor $T_1$, such as shown in FIG. 1. As seen in FIG. 3B, however, second photo-resist mask 42 overlies a portion of polysilicon layer 40 filling separation distance 38 between gate insulator 20 and insulative layer 32. Then as understood from FIG. 3C, the dry etching leaves at the edge of gate layer 18 adjacent to separation distance 38 a portion of polysilicon layer 40 that contacts surface 16 of substrate 12 between trench 44 and the side edge 52 of gate insulator 20 opposite therefrom. This portion of polysilicon layer 40 is integral with gate layer 18 and will be referred to hereinafter as extension 50 thereof.

Thereafter as shown in FIG. 3D, by suitable deposition and patterning techniques, an electrically insulating oxide layer 54 is created that covers a portion 65 of the floor 46 of trench 44 and the side edge 56 of gate layer 18 at extension 50 thereof. Using oxide layer 54 as a mask, $n^+$-type ions are implanted in the portion of floor 46 of trench 44 not covered by oxide layer 54, forming thereat an $n^+$-type ion implant region 58.

The structure illustrated in FIG. 3D is then subjected to heat treatment, whereupon the $n^+$-type ions in $n^+$ region 58 diffuse into p-type conductivity well 14 to form an $n^+$-type diffusion region 60 remote from gate layer 18. $N^+$-type diffusion region 60 corresponds, for example, to the diffusion region constituting drain $D_2$ of transistor $T_2$ in FIG. 1. During the same heat treatment, $n^+$-type ions from the polysilicon in gate layer 18 migrate across the portion of surface 16 of substrate 12 contacted by extension 50 of gate layer 18 forming $n^+$-type migration region 62. Migration region 62 extends downwardly into conductivity well 14, as well as laterally beneath gate insulator 20 and, in the opposite direction therefrom, beneath oxide layer 54 and trench 44 to make contact with the side of $n^+$-type ion implant region 60.

In this manner, a current pathway illustrated in FIG. 3E arrows $I_1$, is established between gate layer 18 and $n^+$-type diffusion region 60. Current pathway I corresponds, for example to a current pathway, such as current pathway 28 shown in FIG. 1, between gate $G_1$ of transistor $T_1$ and drain $D_2$ of transistor $T_2$. As current pathway $I_1$ does not pass through top surface 63 of gate layer 18, the contact structure through which current pathway $I_1$ is established is referred to as being buried.

To facilitate future discussions, the bracketed portion of surface 16 of substrate 12 contacted by extension 50 of gate layer 18 will be referred to hereinafter as the surface current pathway interface 64 for the buried contact illustrated Similarly, the region of contact between the sides of $n^+$-type migration region 62 and $n^+$-type diffusion region 60 will be referred to hereinafter as the buried current pathway interface 66 of the buried contact illustrated.

Several problems have become apparent in the structure of a buried contact, such as that illustrated in FIG. 3E. First, due to the depth to which trench 44 penetrates surface 16 of substrate 12, the size of buried current pathway interface 66 is extremely small. In some instances, contact between $n^+$-type migration region 62 and $n^+$-type diffusion region 60 is not even effected, as where trench 44 is simply too deep, or where the number of $n^+$-type ions available for migration from ion implant region 62 and gate layer 18 are relatively few. The failure of $n^+$-type migration region 62 to make contact with -type diffusion region 60 can also result when the duration of the heating used to induce the migration of $n^+$-type ions is too short. The result of a small or ineffective buried current pathway interface 66, however, is an undesirably high resistance to the passage of current along the current path $I_1$. This imposes the need for compensating alterations in other elements of the circuitry.

Another disadvantage of the type of buried contact illustrated in FIG. 3E is the leakage of current out of $n^+$-type regions 60, 62. The deep penetration of trench 44 into surface 16 of substrate 12, alone or in combination with the high resistance created at the relatively small buried current pathway interface 66, contributes to the divergence of current passing along current pathway $I_1$ from its intended route into p-type conductivity well 14 and through boundary 48 into substrate 12.

Such leakage current can result in the SRAM cell becoming unstable and switching from one state to another. Again, engineering changes in other aspects of the configuration, such as the deepening of the $n^+$-type regions 60, 62, can be utilized to combat this phenomenon, but these are undesirable, particularly in a design environment in which miniaturization and component density are to be increased. The problem of leakage current is particularly acute where buried contacts of the type illustrated are employed with semiconductor devices used in computer memory cells. To counteract such leakage current, a higher resistor current is required resulting in increased power consumption. Where the device employing the memory cell is battery operated, that battery must be larger than would otherwise be required.

The sequence of processing steps by which the buried contact illustrated in FIG. 3E is manufactured lead to other disadvantages. For example, in the shaping of insulative layer 32 into gate insulator 20 it is necessary to dispose a photo-resist mask 34 (see FIG. 3A) directly upon that portion of insulative layer 32 which ultimately will become gate insulator 20. In the process, contaminants from photo-resist mask mask 34 enter insulator layer 32 and migrate therefrom in the heating process by which diffusion region 60 and migration region 62 are subsequently created. The migration of such contaminants out of gate insulator 20 electrically weakens gate insulator 20 in its intended function of electrically isolating gate layer 18 from surface 16 of substrate 14. Ion contamination from gate insulator 20 tends to migrate to the oxide-silicon interface at surface 16 of substrate 12. There the contaminants interfere with the establishment of the desired threshold voltages for the resultant overall device. This is particularly troublesome with respect to the turn-on voltages when a transistor device with a buried contact such as that illustrated in FIG. 3E is used, for example, in the context of a memory or logic cell.

BRIEF SUMMARY AND OBJECTS OF THE INVENTION

Thus, one object of the present invention is an improved structure and corresponding method by which to effect a buried contact between the gate of a transistor device and a diffusion region located remote therefrom.

Yet another object of the present invention is to produce integrated semiconductor devices in which necessary interconnections between gate elements of transistor devices and diffusion regions located remote therefrom are effected while minimizing the power demands of the device.

In light thereof, it is an aspect of the present invention to reduce power consumption and to substantially eliminate the problem of early battery depletion in memory cells.

Yet another aspect of the present invention is to provide for semiconductor devices having buried contacts of the types described which have more reliable threshold voltages.

It is an additional object of the present invention to effect buried contacts of the type described without requiring compensating engineering alterations in other aspects of the semiconductor devices to overcome high resistances or leakage currents.

Yet another object of the present invention is to enable continued miniaturization of semiconductor devices and their increased densification in large scale integrated circuitry without unduly sacrificing circuit quality and reliability.

Additional objects and advantages of the invention will be set forth in the description which follows, or may be learned by the practice of the invention.

To achieve the foregoing objects, and in accordance with the invention as embodied and broadly described herein a buried contact is provided between a polysilicon gate disposed on an insulative layer on a substrate and a diffusion region of a first conductivity type located in the surface of the substrate remote from the polysilicon gate. The buried contact comprises a polysilicon interconnect structure that is disposed against the gate and also contacts the surface of the substrate adjacent to an edge of the insulative layer between the gate and the substrate. The portion of the surface of the substrate contacted by the polysilicon interconnect layer defines a surface current pathway interface which is located remote from the diffusion region.

The inventive buried contact further comprises a migration region of the same conductivity type as the diffusion region. The migration region is disposed in the surface of the substrate below the surface current pathway interface extending laterally from the surface current pathway interface in a direction away from the gate to contact a side of the diffusion region. The migration region is formed by the diffusion of carriers from the gate through the polysilicon interconnect structure into the substrate at the surface current pathway interface. In this manner, a low-resistance current pathway is established from the gate through the polysilicon interconnect structure and the surface current pathway interface into the migration region in the substrate and from there into the diffusion region.

The polysilicon interconnect structure is created by isotropic deposition and contacts a side edge of the insulative layer below the gate. In one preferred embodiment, the polysilicon interconnect structure is disposed against a side edge of the gate opposite the surface current pathway interface and also against the bottom surface of the gate that adjoins that side edge. A portion of the polysilicon interconnect structure thus extends below the gate to contact the side of the insulative layer upon which the gate is disposed. In this configuration, in a plane normal the surface of the substrate and normal the side edge of the gate, the polysilicon interconnect structure exhibits a generally L-shaped cross-section.

An insulative layer is formed on the surface of the polysilicon interconnect structure opposite from the gate. The insulative layer contacts the surface of the substrate adjacent the surface current pathway interface to define there an insulator contact surface. The insulator contact surface includes at least a portion of the boundary between the diffusion region and the migration region. The surface current pathway interface and an insulator contact surface of the resulting buried contact are substantially coplanar.

The buried contact disclosed herein is believed to have ready applicability in logic and memory cells. There, the gate of a first transistor device is electrically coupled through the buried contact to the diffusion region constituting a source or drain of another transistor device.

The invention described herein also includes a method for effecting electrical contact between the gate of a transistor device formed at the surface of a substrate and a diffusion region of the same conductivity type located in the surface of the substrate remote from the transistor device. In that method, a thin insulative layer is formed on the surface of the substrate and a polysilicon gate is formed on the insulative layer. Then the insulative layer is isotropically etched at a side edge of the gate to expose the surface of the substrate. A polysilicon interconnect layer is isotropically deposited on a side surface of the gate and on the surface of the substrate exposed during isotropic etching. Anisotropic etching of the polysilicon interconnect layer removes that layer from a portion of the surface of the substrate separated from the gate. As a result, from the polysilicon interconnect layer a polysilicon interconnect structure is produced which is disposed against the gate and is in contact with the portion of the surface of the substrate exposed by isotropic etching. The surface of the substrate contacted by the polysilicon interconnect structure defines a surface current pathway interface that is located remote from the diffusion region.

Thereafter the exposed surface of the polysilicon interconnect structure is insulated, and ion migration is induced from the gate through the polysilicon interconnect structure into the substrate to form below the surface current pathway interface a migration region. That migration region extends laterally from the current pathway region away from the gate to contact a side of the diffusion region.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention and the presently understood best mode thereof will be described with additional specificity and detail through the use of the accompanying drawings in which.

DETAILED DESCRIPTION OF THE PREFERRED EMBODIMENTS

Figure 4A:
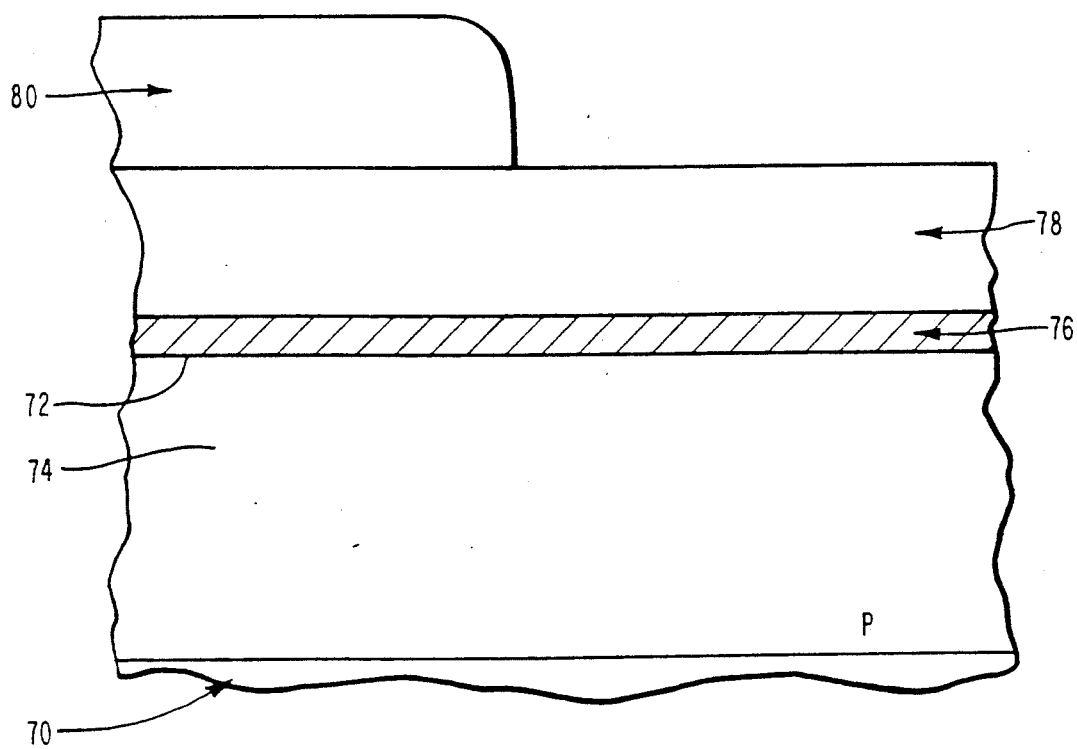
FIGS. 4A–4G are a series of cross-sectional elevational views illustrating the steps in one embodiment of an inventive method for forming a buried contact between a gate and a diffusion region remote therefrom.
Figure 4B:
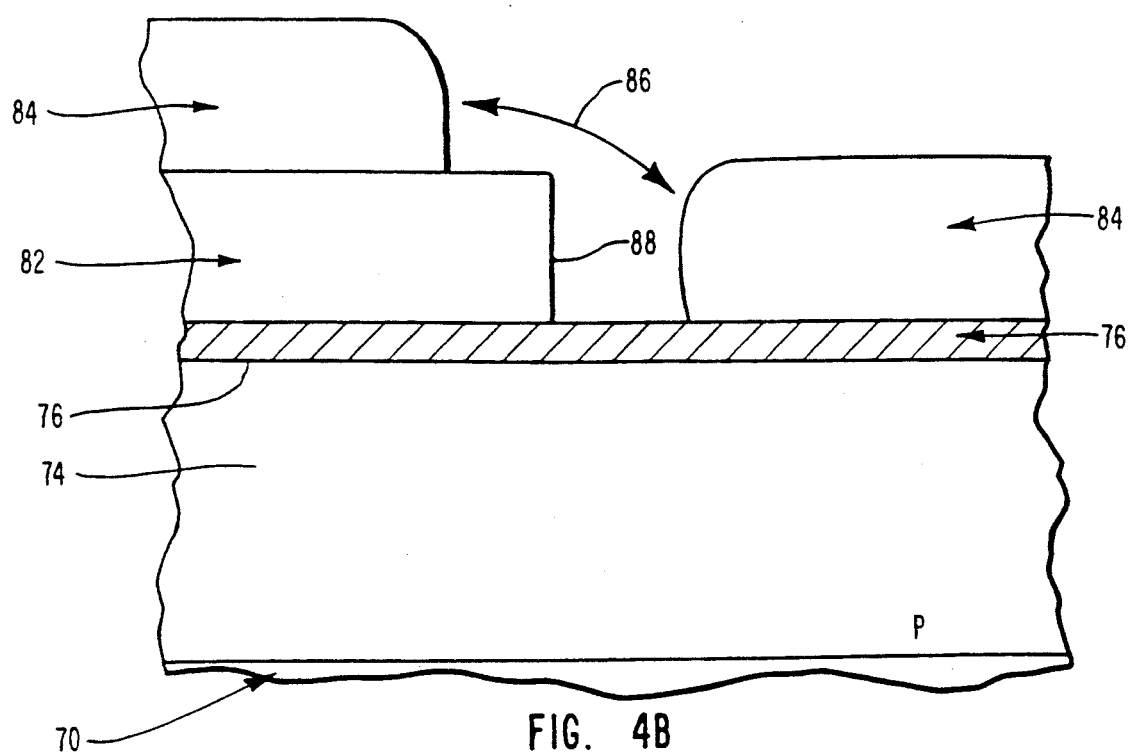
Figure 4C:
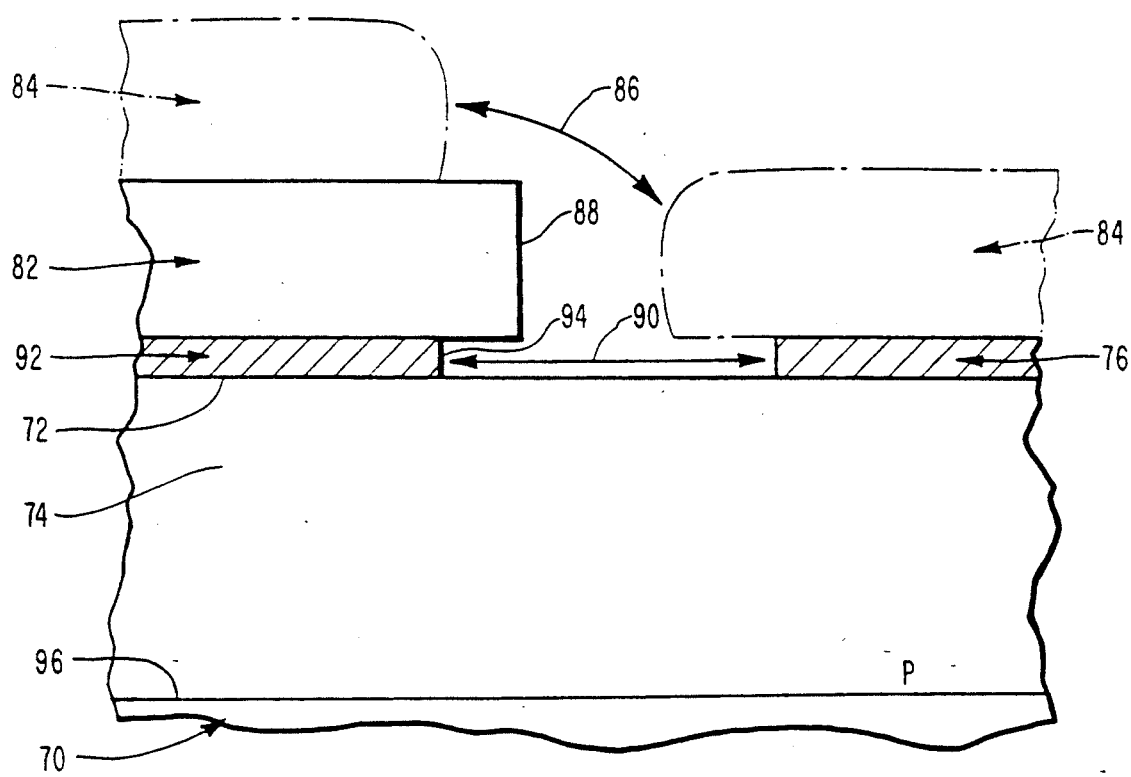
Figure 4D:
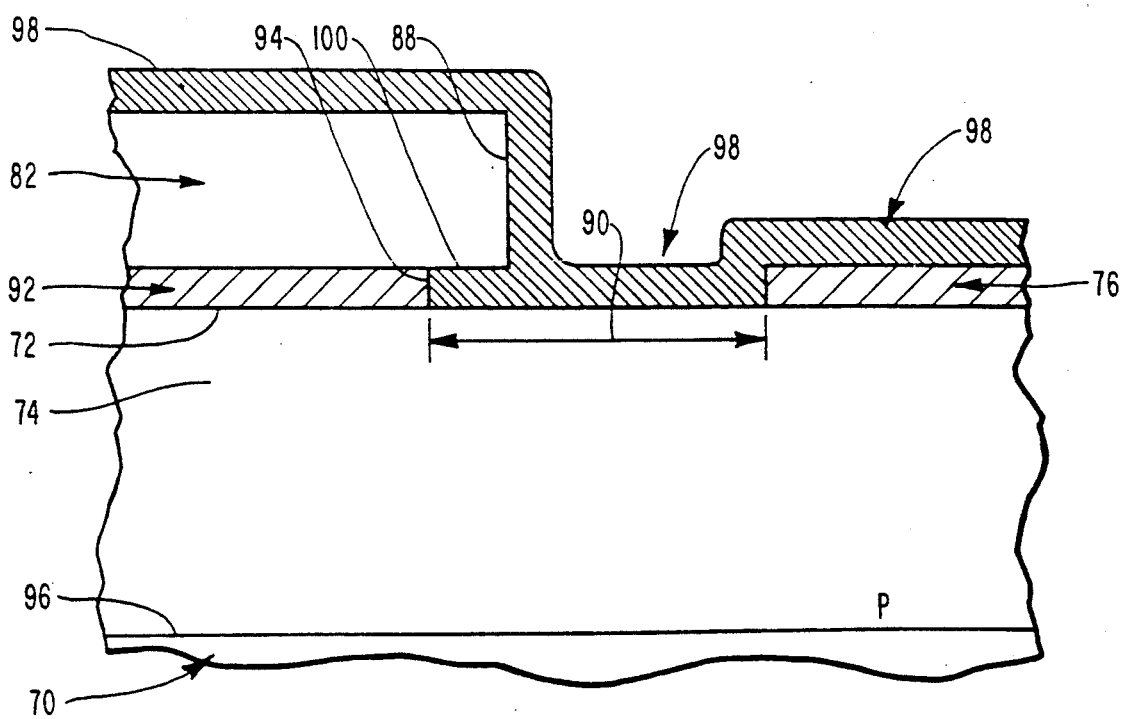
Figure 4E:
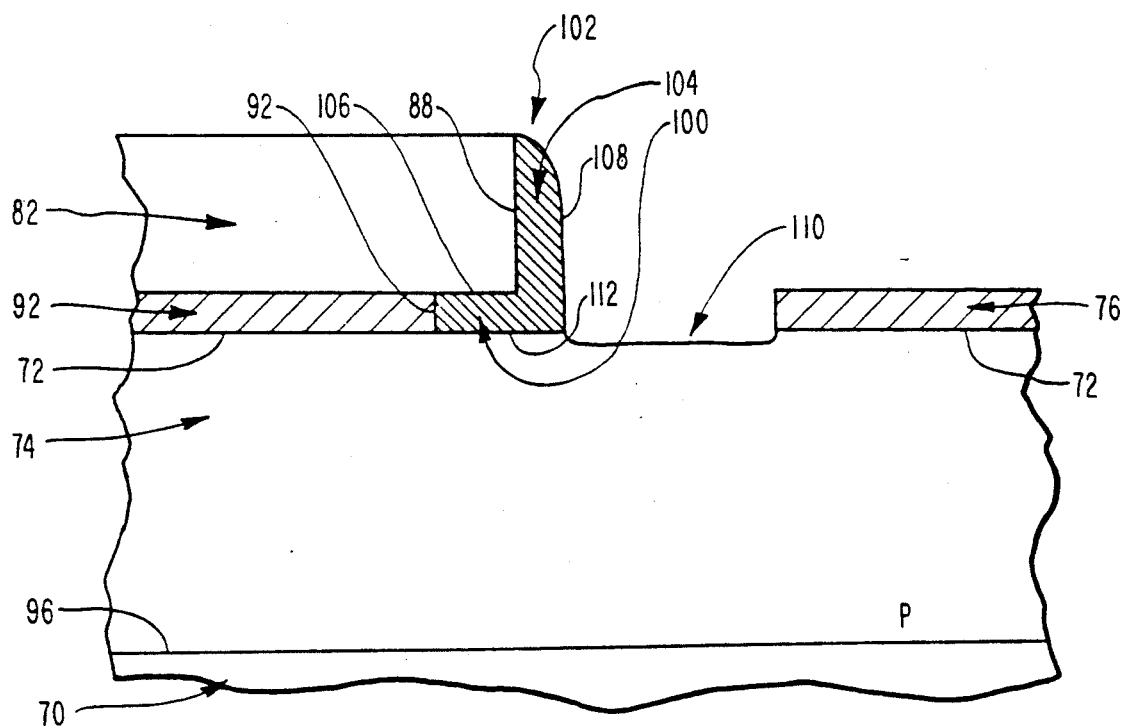
Figure 4F:
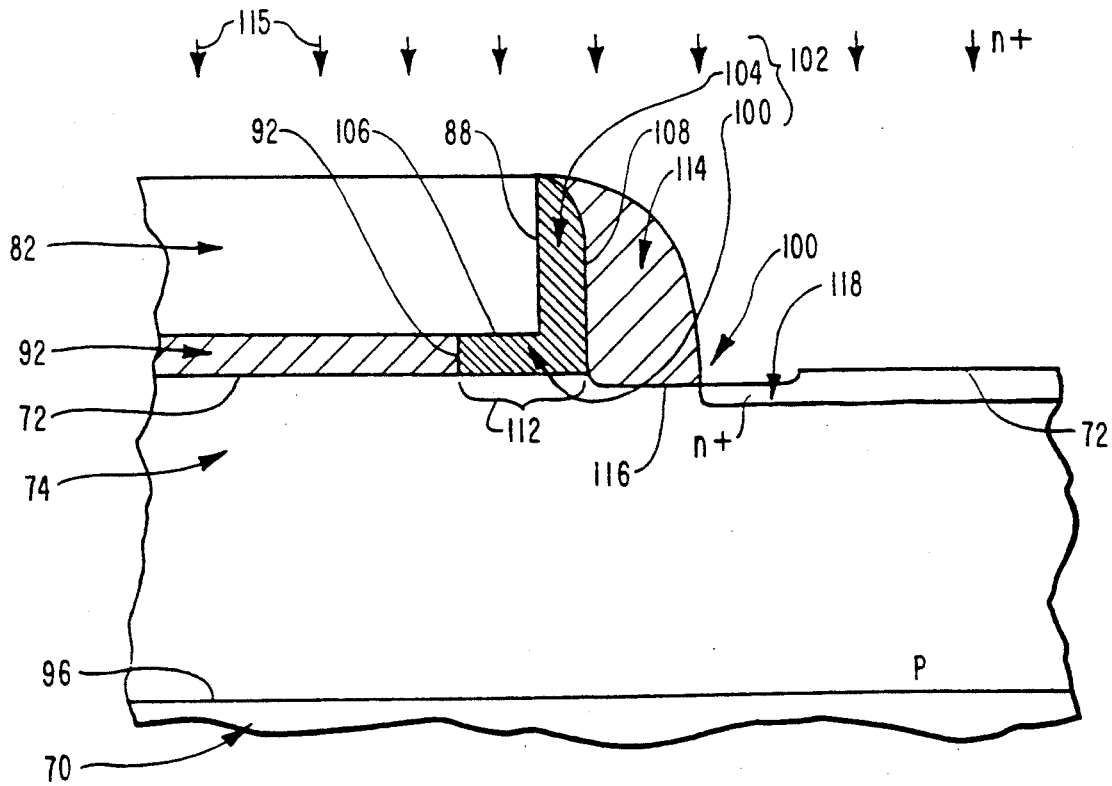
Figure 4G:
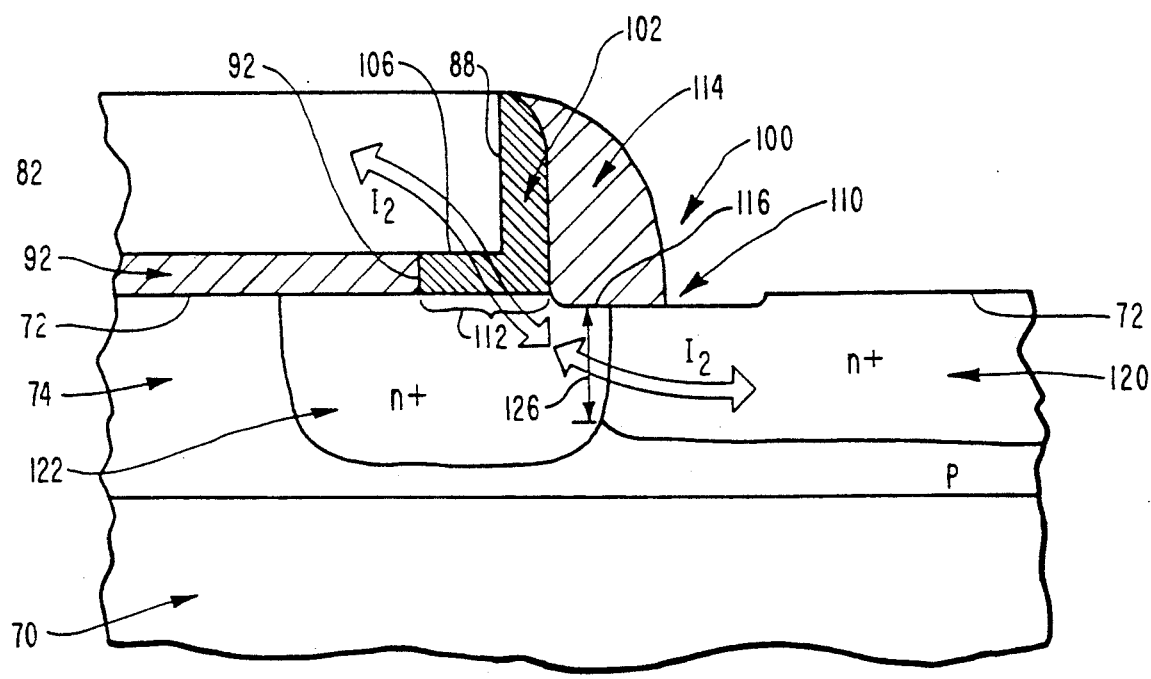

FIGS. 4A–4G illustrate steps in one embodiment of a method of manufacturing a buried contact between a polysilicon gate disposed on an insulative layer on a substrate and a diffusion region of a first conductivity type located in the surface of the substrate remote from the polysilicon gate. The structure as shown in FIG. 4G, accordingly, represents one embodiment of a structure of such a buried contact configured according to the teachings of the present invention.

Figure 1:
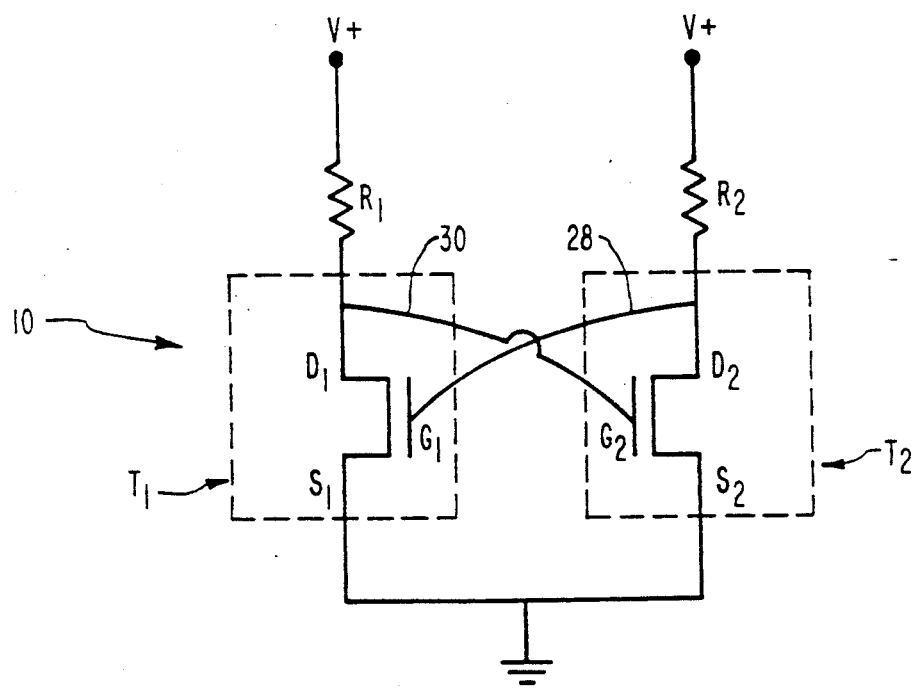
FIG. 1 is an electrical schematic drawing of a pair of transistor devices cross-coupled to form a random access memory cell requiring at least one buried contact between a gate and a remote diffusion region.
Figure 2:
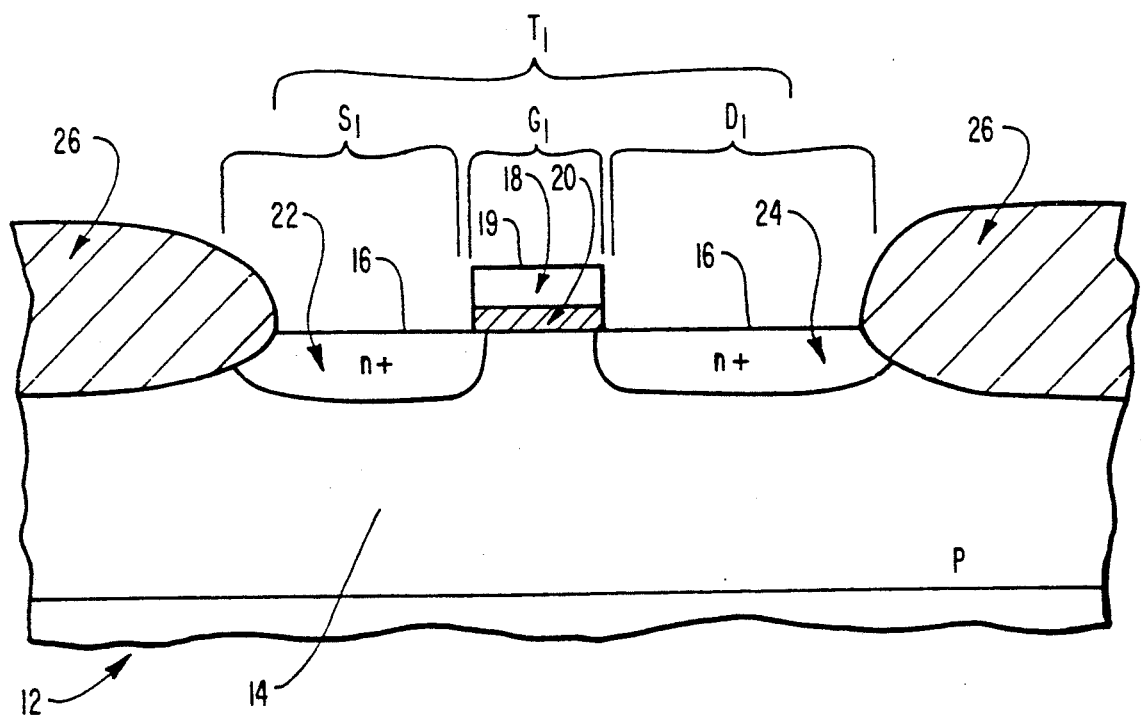
FIG. 2 is a cross-sectional elevation view of a typical semiconductor transistor device.

FIG. 4A illustrates a substrate 70 having a surface 72 in which is formed a p-type conductivity well 74. A thin insulative layer 76, typically of silicon dioxide, is grown on surface 72 of substrate 70 at p-type conductivity well 74. Through subsequent processing, insulative layer 76 will be formed into a gate insulator, such as gate insulator 20 shown in FIG. 2. Nevertheless, in contrast to the previously described known methods for producing a buried contact between the gate that would correspond to such a gate insulator and a buried diffusion region formed in surface 72 of substrate 70 remote from that gate, a thick polysilicon layer 78 is next deposited over the entirety of insulative layer 76. Through subsequent etching, polysilicon layer 78 will be fashioned into a gate, such as gate layer 18 shown in FIG. 2, of a transistor device disposed on the gate insulator that is to be fashioned from insulative layer 76.

Toward both of those ends, a photo-resist mask 80 is formed over the entirety of polysilicon layer 78 and developed to shield only a portion thereof as shown in FIG. 4A. Because photo-resist mask 80 makes no contact whatsoever with insulative layer 76, impurities from photo-resist mask 80 cannot enter insulative layer 76. It will be recalled, that such impurities in insulative layer 76 impair the insulating capacity of that layer in its function as a gate insulator. In addition, such impurities during subsequent heating treatment of substrate 70 migrate to the interface between the insulative layer 76 and the substrate 70, interfering with the achievement of desired threshold voltages. Accordingly, in producing the buried contact illustrated in the steps shown in FIGS. 4A through 4G, a device is produced with a buried contact but without the disadvantages just suggested.

Figure 3A:
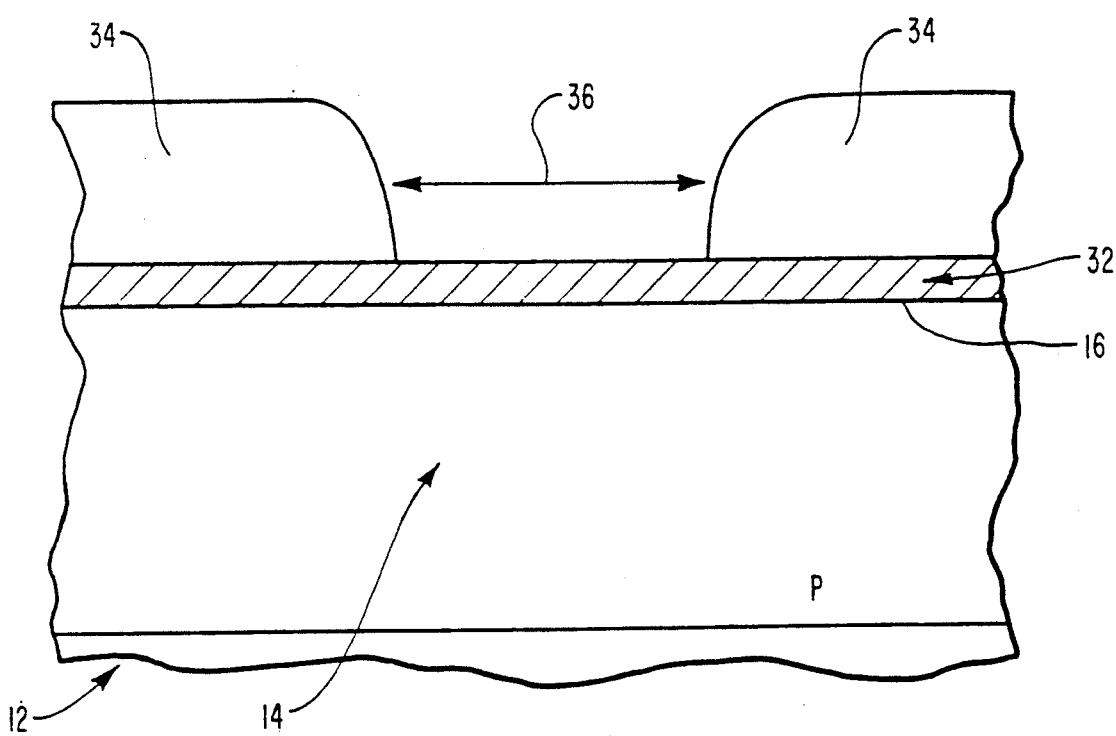
FIGS. 3A–3E are a sequence of cross-sectional elevation views illustrating the steps in a known method for manufacturing a buried contact between a gate and a remote diffusion region.
Figure 3B:
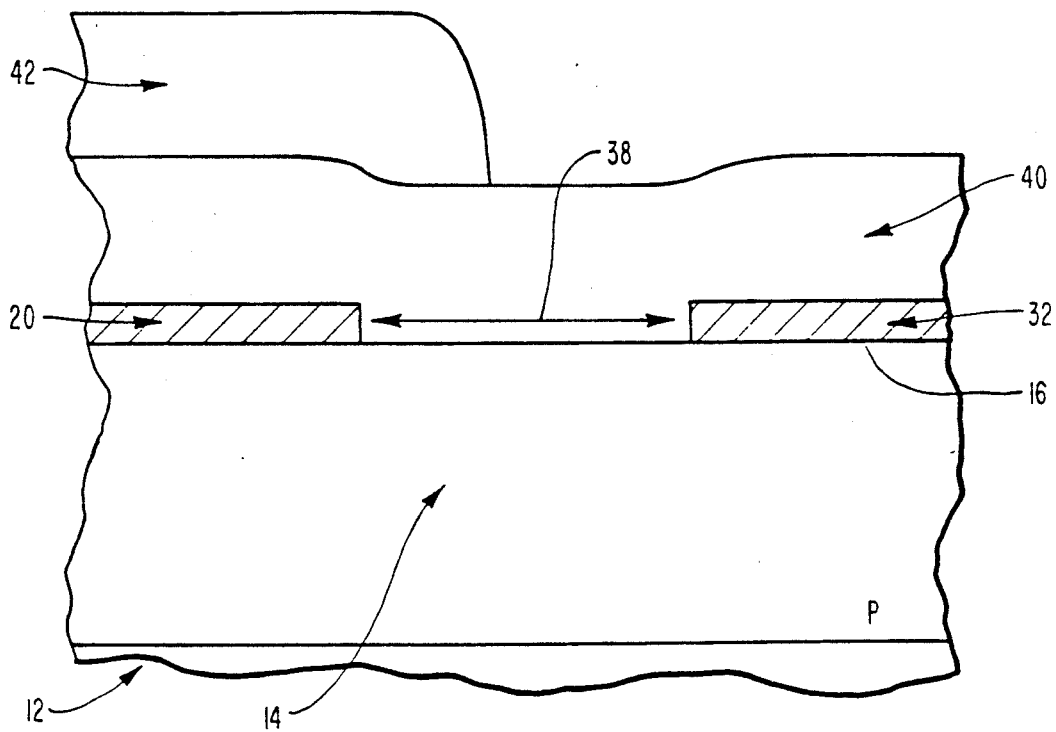
Figure 3C:
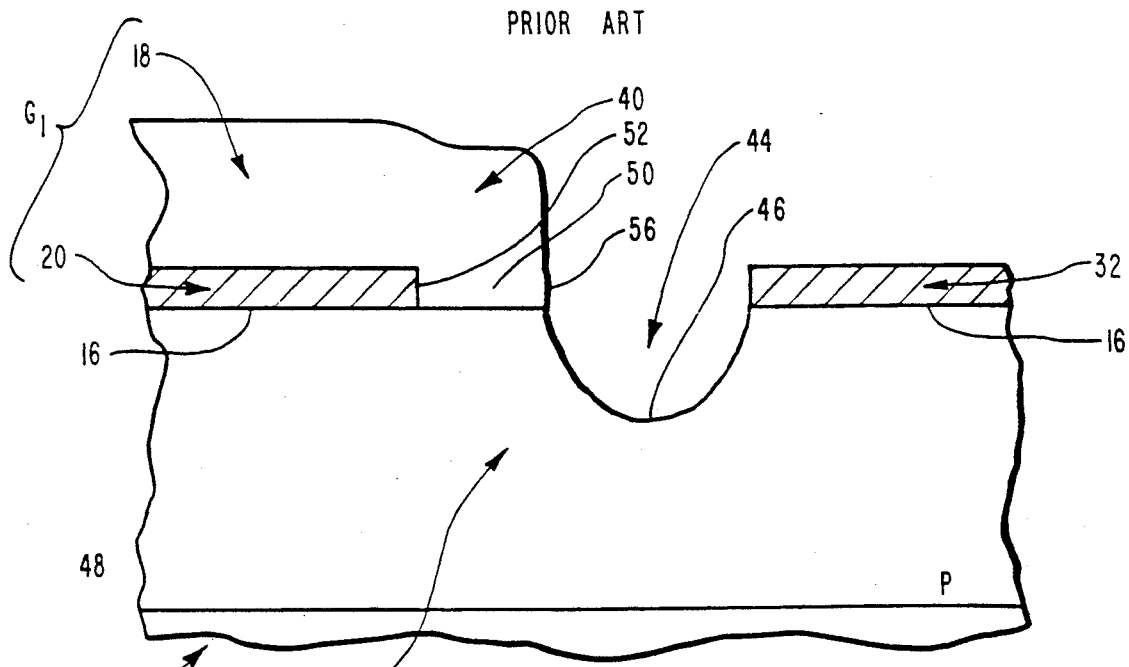
Figure 3D:
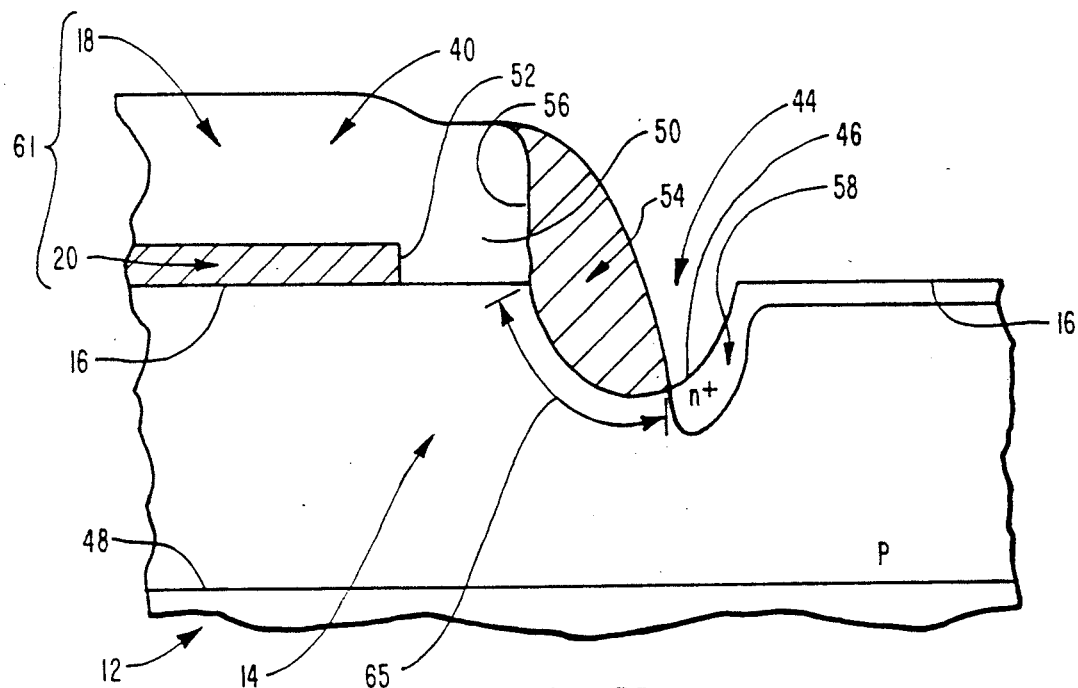

The portion of polysilicon layer 78 not covered by photo-resist mask 80 are etched away down to the top surface of insulative layer 76. The result is the formation of a gate layer 82 from polysilicon layer 78. Advantageously, once the etching process reaches insulative layer 76, the removal of material terminates, regardless of the timing involved. Thus, it is readily possible without over-etching to achieve the objective of same, namely to completely remove unwanted portions of polysilicon layer 78 from the top surface of insulative layer 76. Nevertheless, unlike the etching step by which polysilicon layer 40 is formed into gate layer 18 and trench 44 shown in FIG. 3C is created due to over-etching, the surface 72 of substrate 70 by being protected from etching by insulative layer 76 remains essentially planar. The advantages of such a result will be apparent through further discussions of the inventive method.

Thereafter, in order to form from insulative layer 76 a localized gate insulator between gate layer 82 and substrate 70, a second photo-resist mask 84 is formed over the entirety of gate layer 82 and the exposed portion of insulative layer 76. An opening 86 at a side edge 88 of gate layer 82 is formed in second photo-resist mask 84 so as to expose the portion of insulative layer 76 immediately adjacent to a side edge 88 of gate layer 82. Processing to this point is illustrated in FIG. 4B.

Thereafter, the structure illustrated in FIG. 4B is subjected to isotropic wet etching with hydrofluoric acid. This type of etching removes exposed portions of insulative layer 76 in all directions. Thus, the isotropic etching not only removes insulative layer 76 in opening 86 between side edge 88 of gate layer 82 and the portion of second photo-resist mask 84 shown opposite thereto on the right side of FIG. 4B, but that etching also removes insulative layer 76 from beneath gate layer 82 and from the portion of second photo-resist mask 84 located on the right side of FIG. 4B. This removal of insulative layer 76 proceeds to an extent that is dependent directly upon the duration of the etching process. Thereafter, all portions of the second photo-resist mask 84 are removed.

The resulting structure is shown in FIG. 4C, wherein both portions of the removed second photo-resist mask 84 are shown in phantom for reference purposes. There, it can be seen that a portion 92 of insulative layer 76 has been isolated by a separation 90 to form a gate insulator 92 upon which is disposed gate layer 82. In the vicinity of separation 90 gate layer 82 overhangs surface 72 of substrate 70 and a side edge 94 of gate insulator 92. The undercutting of gate layer 82 is again the result of the same isotropic etching of insulative layer 76, which also causes insulative layer 76 at the opposite side of separation 90 to be etched from beneath the portion of second photo-resist mask 84 shown in phantom on the right side of FIG. 4C. The isotropic etching of insulative layer 76 does not attack substrate 70 itself, however. Surface 72 of substrate 70 in the vicinity of separation 90 between insulative layer 76 and gate layer 82 accordingly remains relatively planar. Thus, in the forming of gate layer 82 and gate insulator 92, substantially no erosion occurs in surface 72 of substrate 70 that brings surface 72 closer to the lower boundary 96 of p-type conductivity well 74. Thereafter, as shown in FIG. 4D, a polysilicon interconnect layer 98 is isotropically deposited over the entirety of the structure illustrated in FIG. 4C. Typically, this can be accomplished by placing substrate 70 in a hot low pressure environment of silane ($SiH_4$). The silane decomposes to deposit silicon on all exposed surfaces of substrate 70. As will be observed from FIG. 4D, this includes the deposition of silicon in the resulting polysilicon interconnect layer in the area 90 on surface 72 of substrate 70. Thus, polysilicon interconnect layer 98 contacts side edge 88 of gate layer 82 fills separation 90, and covers the portion of insulative layer 76 shown on the right side of FIG. 4D. In addition a portion 100 of polysilicon interconnect layer 98 extends between gate layer 82 and surface 72 of substrate 70 to contact side edge 94 of gate insulator 92.

Thereafter, polysilicon interconnect layer 98 is anisotropically etched without any masking whatsoever in order to remove the topmost surface layer thereof. Such anisotropic etching can be accomplished in a dry plasma of fluorine or chlorine ions with an electrical field established between substrate 70 and the plasma. The resulting bombardment of fluorine or chlorine ions on the surface of polysilicon interconnect layer 98 produces a gaseous reaction product which is removed from the atmosphere. Eventually, the structure illustrated in FIG. 4E is produced.

All exposed horizontal portions of polysilicon interconnect layer 98 are removed leaving only a polysilicon interconnect structure 102 disposed against gate 82 and contacting surface 72 of substrate 70 adjacent side edge 94 of gate insulator 92. A vertically disposed portion 104 of polysilicon interconnect layer 98 which contacts side edge 88 of gate layer 82, in combination with a horizontal portion 100 of polysilicon interconnect layer 98 remain following the anisotropic etch. Together these comprise the resultant polysilicon interconnect structure 102. Polysilicon interconnect structure 102 is thus disposed against side edge 88 of gate layer 82 and in addition contacts bottom surface 106 of gate layer 82 adjacent to side edge 88 thereof. Polysilicon interconnect structure 102 thus assumes a generally orthogonally-shaped cross-section as seen in FIG. 4E, and has an exposed side 108 remote from gate 82.

In order to ensure the full removal of unwanted portions of polysilicon interconnect layer 98, a certain degree of over-etching is required, and the anisotropic etching by which polysilicon interconnect layer 98 is formed into polysilicon interconnect structure 102 does result to a degree in the erosion of surface 72 of substrate 70 between vertical portion 104 of polysilicon interconnect layer 98 and the portion of insulative layer 76 shown on the right side of FIG. 4E. This results in a mild depression 110 in surface 72 at the location described. The portion of surface 72 of substrate 70 contacted by polysilicon interconnect structure 102 defines a surface current pathway interface 112. The degree of penetration of depression 110 into surface 72 of substrate 70 is relatively easy to control, so that depression 110 and surface current pathway interface 112 are, even following the step of anisotropic etching, substantially planar.

Thereafter, an oxide layer 114 is developed and shaped on the exposed surface 108 of polysilicon interconnect structure 102 remote from gate layer 82. Oxide layer 114 thus insulates polysilicon interconnect structure 102 from electrical contact and extends into depression 110 to mask a portion thereof. As used hereinafter, that portion of depression 110 contacted by oxide layer 114 will be defined as an insulator contact surface 116.

Using oxide layer 114 as a mask, the portion of depression 110 not included within insulator contact surface 116 is implanted with n+-type ions by any known method in order to produce an n+-type implant region 118 located remote from gate 82. The result of processing to this point is shown in FIG. 4F.

Substrate 70 is then subjected to heat treatment which produces two structures in the surface of substrate 70 between gate 82 and the portion of insulative layer 76 located to the right in FIG. 4F. First, heat treatment causes the migration of the n+-type ions in implant region 118 downwardly into p-type conductivity well 74 and laterally beneath oxide layer 114 and beneath the portion of insulative layer 76 located on the right in FIG. 4F. The result is an n+-type diffusion region 120 as shown in FIG. 4G.

In addition, however, heat treatment of substrate 70 also causes n+-type carriers to migrate from gate layer 82 through polysilicon interconnect structure 102 and surface current pathway interface 112 into p-type conductivity well 74 producing n+-type migration region 122, also shown in FIG. 4G. N+-type migration region 122 extends downwardly into p-type conductivity well 74 and laterally both beneath gate insulator 92 and in the direction opposite therefrom beneath oxide layer 114 to contact a side of n+-type diffusion region 120. As used herein, the region of contact between n+-type migration region 122 and n+-type diffusion region 120 will be referred to as the buried current pathway interface 126 for the buried contact that results.

Figure 3E:
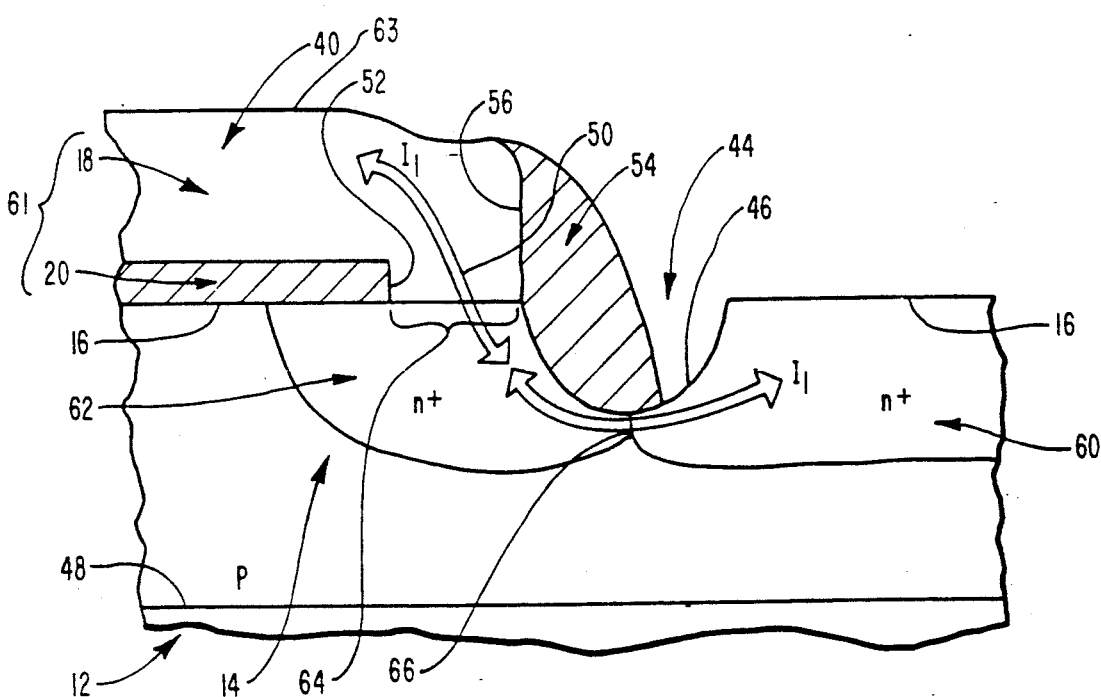

Advantageously, buried current pathway interface 126 is substantially larger than the corresponding buried current pathway interface 66 produced by known methods for manufacturing a buried contact and shown in FIG. 3E. This occurs because depression 110, which is formed by the removal of relatively thin polysilicon interconnect layer 98 does not penetrate surface 72 of substrate 70 to the extent that trench 44 penetrates surface 16 of substrate 12, the later being formed by etching a much thicker polysilicon layer 40 in the known method of manufacturing a buried contact. While the existence of depression 110 evidences a degree of over-etching, that over-etching is more readily controllable than is the over-etching required in the known method when gate layer 18 is formed after the shaping of a thin oxide layer into gate insulator 20. Advantageously then, surface current pathway interface 112 is substantially co-planar with insulator contact surface 116 located in depression 110. This structure contrasts sharply with the relationship between surface current pathway interface 64 shown in FIG. 3E and the portion of floor 46 of trench 44 contacted by oxide layer 54.

As a result of the reduced trenching, the method and structure of the present invention permit the formation of a large buried current pathway interface 112. This in turn reduces the resistance to the flow of current between gate layer 82 and n+-type diffusion region 120 along the current pathway indicated by arrows $I_2$ in FIG. 4G. The reduction of resistance in this portion of the buried contact structure enables that structure to contain the current moving along current pathway $I_2$, rather than diverting it into p-type conductivity well 74 and therefrom into substrate 70. Leakage current is thus greatly suppressed, and power consumption and heat generation minimized.

In addition, no photo-resist mask contacts the thin oxide layer that is ultimately shaped into gate insulator 92. This prevents contaminates from the photo-resist mask from entering the insulative layer. The migration of such impurities during heat treatment of the structure weaken its insulative properties and compound the difficulty of effecting targeted threshold voltages. The achievement of desired threshold voltages in semiconductor devices employing buried contacts is particularly sensitive in memory and logic cells.

Accordingly, it will be appreciated that the buried contact exemplified in FIG. 4G and the method for producing same result in a highly advantageous structure for interconnecting a gate of a transistor device to a diffusion region in the surface of a substrate remote from that transistor device. The inventive structure and method minimize surface trenching in the substrate and as a result produce a buried contact with lower resistance to current passage than is produced in known methods. Correspondingly, the inventive structure when utilized in memory cells dissipates less power and to problematic heat build-up.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Patent is:

1. A buried contact between a polysilicon gate and a diffusion region of a first conductivity type, said polysilicon gate having both a bottom surface and a plurality of vertical sides above the bottom surface and being disposed on a first insulative layer on a substrate, said diffusion region being located in the surface of the substrate remote from the polysilicon gate, said buried contact comprising:

(a) a polysilicon interconnect structure, having both a bottom surface and a plurality of vertical sides above the bottom surface, disposed both above the first insulative layer on the substrate and against at least one of said plurality of vertical sides of the gate and contacting both the surface of the substrate and the first insulative layer, said polysilicon interconnect structure contacting the surface of the substrate to define thereat a surface current pathway interface located at the surface of said substrate remote and separated from the diffusion region;

(b) a migration region of the first conductivity type disposed in the surface of the substrate below and in contact with all of said surface current pathway interface, said migration region extending laterally from said surface current pathway interface away from the gate to contact the diffusion region; and (c) a second insulative layer disposed against at least one of said plurality of sides of said polysilicon interconnect structure remote from the gate, said second insulative layer contacting the surface of the substrate adjacent said surface current pathway interface to define thereat an insulator contact surface, said insulator contact surface including at least a portion of the boundary between said diffusion region and said migration region;

wherein said surface current pathway interface and said insulator contact surface are substantially coplanar.

2. A buried contact as recited in claim 1, wherein said edge of the insulative layer comprises a side edge, and wherein said polysilicon interconnect structure contacts the side edge of the insulative layer.

3. A buried contact as recited in claim 2, wherein a portion of said polysilicon interconnect structure extends below the gate and contacts said side edge of the insulative layer upon which the gate is disposed.

4. A buried contact as recited in claim 1, wherein said gate comprises a side edge that overhangs said surface current pathway interface, and wherein said polysilicon interconnect structure is disposed against the side edge of the gate overhanging said surface current pathway interface.

5. A buried contact as recited in claim 1, wherein said polysilicon interconnect structure is disposed between the gate and the substrate at said edge of the insulative layer.

6. A buried contact as recited in claim 1, wherein said gate comprises a side edge that overhangs said surface current pathway interface, and wherein said polysilicon interconnect structure is disposed against the side edge of the gate overhanging said surface current pathway interface and against the bottom of the gate adjoining to said side edge thereof.

7. A buried contact as recited in claim 6, wherein said polysilicon interconnect structure comprises a generally orthogonally-shaped cross-section in a plane oriented normal the surface of the substrate and normal said side edge of said gate.

8. A buried contact as recited in claim 1, wherein said polysilicon interconnect structure is created by isotropic deposition.

9. A buried contact as recited in claim 1, wherein the gate is of the first conductivity type, and wherein said migration region is formed by diffusion of carriers of a first conductivity type from the gate through said polysilicon interconnect structure into the substrate at said surface current pathway interface.

10. A buried contact as recited in claim 1, wherein the gate is the gate of a first transistor device and the diffusion region is one of the source and drain of a second transistor device.

11. A buried contact as recited in claim 10, wherein said first and second transistor devices are cross-coupled at the gates thereof.

12. A buried contact as recited in claim 11, wherein said first and second transistors comprise a binary flip-flop circuit.

* * * * *

UNITED STATES PATENT AND TRADEMARK OFFICE
CERTIFICATE OF CORRECTION

PATENT NO. : 5,206,532
DATED : April 27, 1993
INVENTOR(S) : MARTIN C. ROBERTS

It is certified that error appears in the above-identified patent and that said Letters Patent is hereby corrected as shown below:

```
Column 3, line 5, "over etching" should be --overetching--
Column 3, line 64, after "illustrated" insert --,--
Column 9, line 2, after "gate layer 82" insert --,--
Column 12, lines 7-8, "said edge" should be --an edge--
Column 12, line 8, after "of the" insert --first--
Column 12, line 10, after "of the" insert --first--
Column 12, line 14, before "insulative" insert --first--
Column 12, line 23, "said edge" should be --an edge--
```

Signed and Sealed this

Twenty-fourth Day of January, 1995

Attest:

BRUCE LEHMAN

Attesting Officer

Commissioner of Patents and Trademarks